US006789242B1

(12) United States Patent
Liu

(10) Patent No.: US 6,789,242 B1
(45) Date of Patent: Sep. 7, 2004

(54) METHOD AND SYSTEM FOR INTEGRATED CIRCUIT DESIGN AND DIAGNOSIS

(75) Inventor: Lung-Chun Liu, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 142 days.

(21) Appl. No.: 10/012,642

(22) Filed: Nov. 13, 2001

Related U.S. Application Data

(60) Provisional application No. 60/266,812, filed on Feb. 5, 2001.

(51) Int. Cl.$^7$ .............................................. G06F 17/50
(52) U.S. Cl. ................. 716/6; 716/11; 703/19
(58) Field of Search ............................ 716/11, 1, 2, 4, 716/5, 6, 7, 18; 703/13, 14, 15, 16, 17, 19

(56) References Cited

U.S. PATENT DOCUMENTS

| | | | | |
|---|---|---|---|---|
| 4,587,625 A | * | 5/1986 | Marino et al. ................. 703/14 |
| 4,675,832 A | * | 6/1987 | Robinson et al. ............ 345/441 |
| 4,791,593 A | * | 12/1988 | Hennion ....................... 703/14 |
| 5,220,512 A | * | 6/1993 | Watkins et al. ................ 716/11 |
| 5,381,524 A | * | 1/1995 | Lewis et al. ................. 345/804 |
| 5,555,201 A | * | 9/1996 | Dangelo et al. ................ 716/1 |
| 5,615,356 A | * | 3/1997 | King et al. .................... 703/21 |
| 5,949,690 A | * | 9/1999 | Lawman ........................ 716/6 |
| 6,029,262 A | * | 2/2000 | Medd et al. ................. 714/724 |

* cited by examiner

Primary Examiner—Leigh M. Garbowski
(74) Attorney, Agent, or Firm—Bingham McCutchen LLP

(57) ABSTRACT

A method for displaying a schematic diagram of a circuit showing multiple time-frame signal values across storage elements includes identifying one or more time-frames in a circuit. The one or more time-frames are determined from a number of consecutive storage elements in a signal path in the circuit. The method also includes receiving a request to display signal values associated with a first storage element at a time-frame t. The method further includes displaying a first signal value carried on a first signal line coupled to an output of the first storage element at time-frame t and displaying a second signal value carried on a second signal line coupled to an input of the first storage element at time-frame t−1. In another embodiment, the method identifies any loops that are in the circuit. In a loop, a signal value comes from a gate at a time-frame and loops back to a loop-back gate at an earlier time-frame. Having identified a loop in the circuit, the method displays elements in the loop at different time-frames instead of showing the loop in the schematic representation.

41 Claims, 10 Drawing Sheets

METHOD AND SYSTEM FOR INTEGRATED CIRCUIT DESIGN AND DIAGNOSIS

CLAIM FOR PRIORITY

This application claims the benefit of priority under 35 U.S.C. §119(e) of U.S. Provisional Application Number 60/266,812, entitled "Multiple Time-Frame Signal Value Display in Circuit Schematic Diagram" filed on Feb. 5, 2001, the entirety of which is incorporated herein by reference.

BACKGROUND

1. Field

The invention relates to software tools for assisting circuit designers in the task of analyzing integrated circuit designs.

2. Description of the Related Art

A circuit design must be carefully designed and tested before it is implemented as an integrated circuit on a silicon chip. If a circuit design has faults that make it operate incorrectly after implementation, the effort and expense of implementing the faulty circuit is wasted. In addition, significant effort and expense is involved in finding and correcting the faults. The need for accurate designs have become increasingly important as integrated circuits have become larger and more complex. Numerous software tools are available for designing and analyzing integrated circuit designs. An aspect of certain software design tools is a user interface that allows a designer to view a gate-level representation of a circuit.

FIG. 1 depicts an exemplary gate level design of a circuit 100 that has storage elements and combinatorial elements. The storage elements can be a delay-type flip-flop such as, by way of example, D flip-flops 102–107. The combinatorial gates include inverters 108, 109, and 110, AND gates 111 and 112, NOR gate 113, and OR gate 114. Each of the flip-flops 102–107 outputs the signal on a line coupled to its respective D input when it receives an appropriate clock signal on its CLK input. The combinatorial gates, on the other hand, produce an output based on the value of their input signals almost instantaneously in response to a change in the signal value carried on their input lines.

Software tools exist for simulating the behavior of circuit 100. If circuit 100 does not behave as expected, the designer must determine where the fault is. For example, the designer may have designed circuit 100 to produce a signal value of "1" on an output line 122 given a signal value of "0" on an input line 120. Thus, as depicted in FIG. 1, the signal value of "0" carried on output line 122 is not expected and thus, signifies an error in circuit 100. The designer typically diagnoses the circuit using conventional simulation or verification tools. A significant disadvantage of existing tools is that the tools only show signal values carried on the input and output lines at a single time-frame. This is shown in FIG. 1 as "1s" and "0s" at the various signal lines. The signal values depicted in FIG. 1 are a snapshot of the signal values carried on the signal lines in circuit 100 at a particular point in time.

FIG. 2 depicts an exemplary user interface display of a conventional software tool depicting signal values for a circuit at a single point in time (in this case, time =3400 nano seconds (ns)). The information displayed in FIG. 2 is of limited use in diagnosing sequential circuits that include storage elements, such as circuit 100. While the value of a combinatorial gate can be derived from the values of its inputs, the output values of a storage element depend upon the signal value of its input at a previous time-frame. A drawback of the existing software tools is that they fail to display signal values at the required time-frames to facilitate efficient design diagnosis.

For example, consider the situation in which the signal value carried on the line coupled to the output of AND gate 112 is incorrect, causing the signal transmitted at the output of flip-flop 107 (once clocked) to be incorrect. A snapshot showing the values of the various signal lines after flip-flop 107 is clocked would show the incorrect value carried on output line 122 (the output of flip-flop 107), but the previous time-frame's input and output signal values, including those for combinatorial elements 110, 112, and 114 would no longer be shown. Therefore, the origin or cause of the incorrect value would not be obvious. Thus, conventional software tools are inadequate for facilitating diagnosis of sequential logic designs.

SUMMARY

The present disclosure is directed to a system and corresponding methods for providing a meaningful signal value display between input signals and output signals of storage elements in a circuit design. One aspect of the present invention is a software verification tool that facilitates circuit design diagnosis by providing a multiple time-frame signal value display across the components in a circuit design, including storage elements.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

In one embodiment, a method for displaying a schematic diagram of a circuit showing multiple time-frame signal values across storage elements includes: identifying one or more time-frames in a circuit, the one or more time-frames being determined by a number of consecutive storage elements in a signal path in the circuit; receiving a request to display signal values associated with a first storage element at a time-frame t; displaying a first signal value carried on a first signal line coupled to an output of the first storage element, the first signal value being at time-frame t; and displaying a second signal value carried on a second signal line coupled to an input of the first storage element, the second signal value being at time-frame t−1.

In another embodiment, a method for displaying signal values at multiple time-frames includes: identifying one or more storage elements in a signal path in a circuit, each of the one or more storage elements identifying a new time-frame; displaying a first signal value carried on a first signal line coupled to one output of a first storage element at a first time-frame; and displaying a second signal value carried on a second signal line coupled to an input of the first storage element at a second time-frame.

In still another embodiment, a computer-readable storage medium has stored thereon computer instructions that, when executed by a computer, cause the computer to: identify one or more time-frames in a circuit, the one or more time-frames being determined by a number of consecutive storage elements in a signal path in the circuit; receive a request to display signal values associated with a first storage element at a time-frame t; display a first signal value carried on a first signal line coupled to an output of the first storage element, the first signal value being at time-frame t; and display a second signal value carried on a second signal line coupled to an input of the first storage element, the second signal value being at time-frame t−1.

In yet another embodiment, a computer-readable storage medium has stored thereon computer instructions that, when executed by a computer, cause the computer to: identify one or more storage elements in a signal path in a circuit, each of the one or more storage elements identifying a new time-frame; display a first signal value carried on a first signal line coupled to one output of a first storage element at a first time-frame; and display a second signal value carried on a second signal line coupled to an input of the first storage element at a second time-frame.

In one embodiment, a method for displaying a schematic diagram of a circuit showing multiple time-frame signal values across storage elements includes: identifying a loop in a signal path, the loop having: a first element at a first time-frame, a second element at a second time-frame, a first signal line coupled to an output of the first element and an input of the second element, and a second signal line coupled to an output of the second element and an input of the first element; replicating the first element at a third time-frame; coupling an output of the replicated first element to the input of the second element via a third signal line; removing the second signal line; displaying a first signal value carried on the first signal line at the first time-frame; displaying a second signal value carried on the second signal line at the second time-frame; and displaying a third signal value carried on the third signal line at the third time-frame.

In another embodiment, a computer-readable storage medium has stored thereon computer instructions that, when executed by a computer, cause the computer to: identify a first element at a first time-frame, a second element at a second time-frame, a first signal line coupled to an output of the first element and an input of the second element, and a second signal line coupled to an output of the second element and an input of the first element; replicate the first element at a third time-frame; couple an output of the replicated first element to the input of the second element via a third signal line; remove the second signal line; display a first signal value carried on the first signal line at the first time-frame; display a second signal value carried on the second signal line at the second time-frame; and display a third signal value carried on the third signal line at the third time-frame.

These and other embodiments of the present invention will also become readily apparent to those skilled in the art from the following detailed description of the embodiments having reference to the attached figures, the invention not being limited to any particular embodiment(s) disclosed.

DETAILED DESCRIPTION

Figure 1:
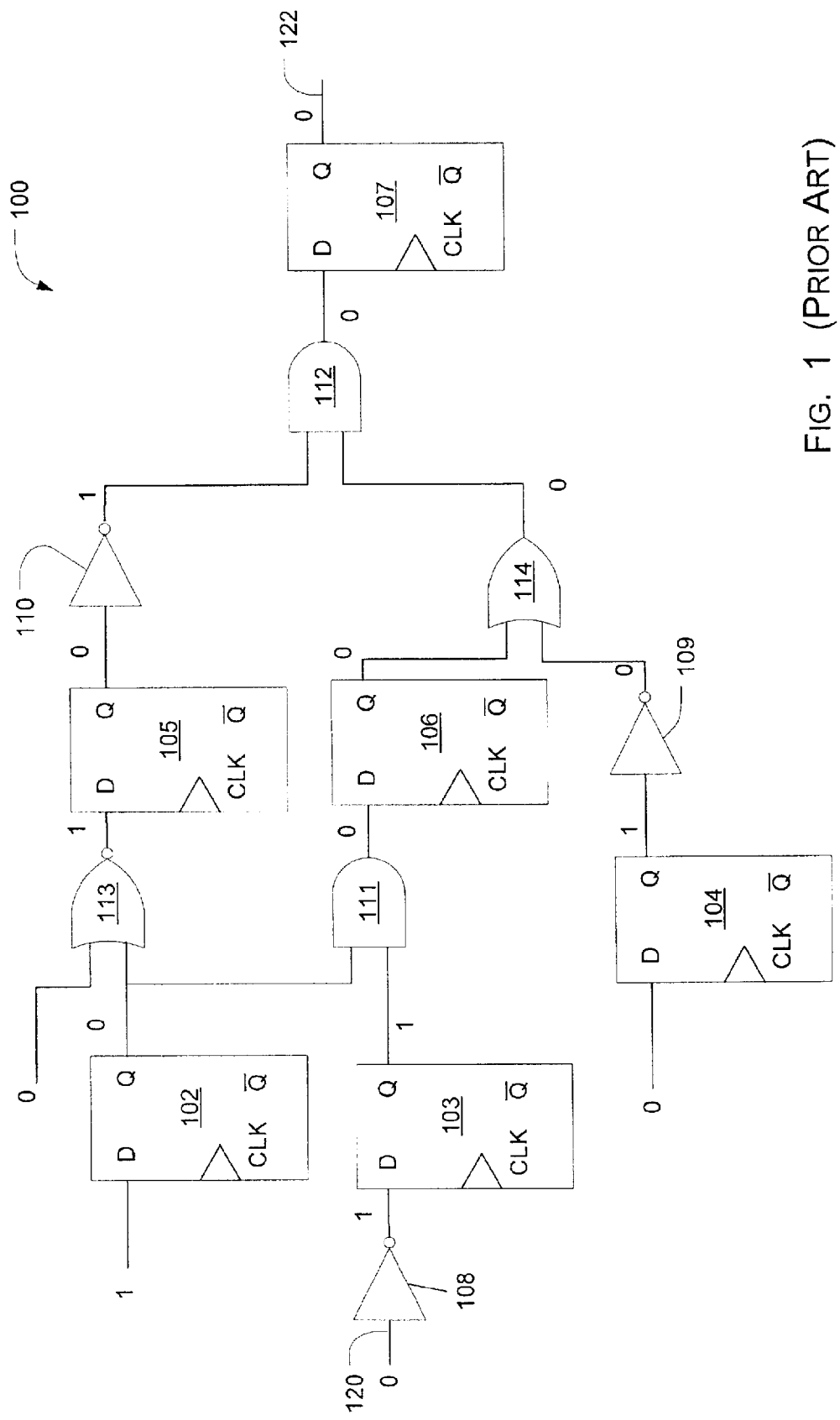
FIG. 1 illustrates an exemplary gate level design of a circuit 100 that has storage elements and combinatorial elements.
Figure 2:
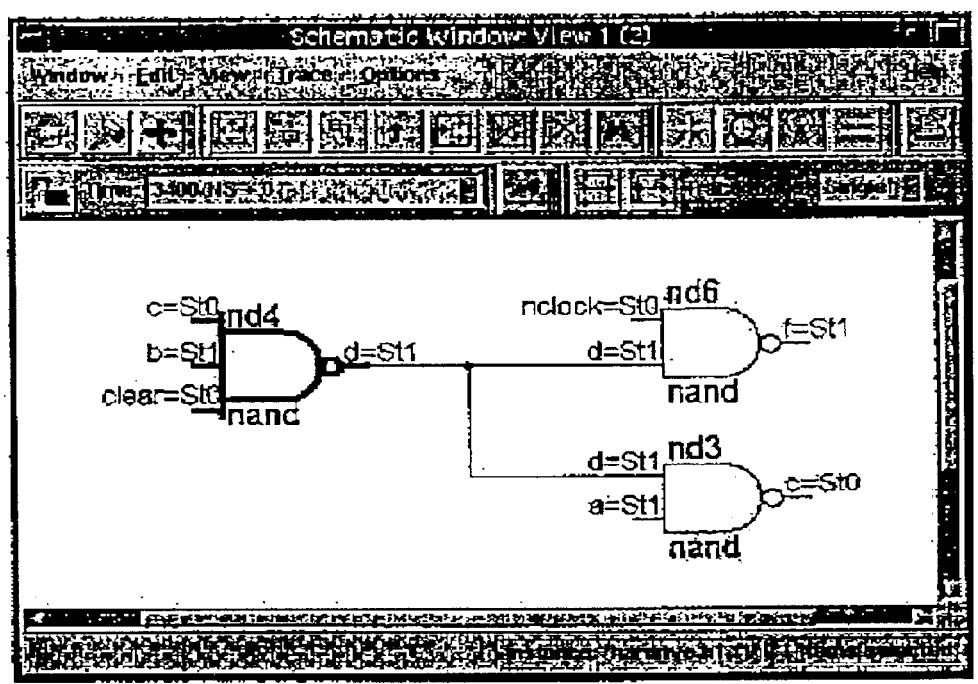
FIG. 2 illustrates an exemplary user interface display of a conventional software tool depicting signal values at a particular point in time.

A system and method for displaying signal values of storage elements in multiple time-frames are described. In one embodiment, a software verification tool receives as input a circuit schematic diagram representation of a circuit design and other input data necessary to perform simulation on the input circuit design. The verification tool uses storage elements in the circuit schematic diagram to determine and identify time-frame boundaries. The verification tool monitors and stores the signal values of the input and output lines coupled to the circuit elements or components in the circuit design during the simulation period. After the simulation period, the verification tool determines an appropriate time-frame for each input and output line coupled to the circuit elements and displays the signal values for each line at the appropriate time-frame.

As used herein, a circuit element or element means any component of a circuit. A circuit element thus includes, for example, gates, storage elements, signal lines, combinatorial gates, logic gates, and the like. Thus, the terms "circuit element" and "circuit component" are used interchangeably herein. A storage element means any circuit element that transfers the signal carried on its input pin to its output pin whenever an appropriate signal is applied to its clock input. Typically, one or more signal lines are coupled to the storage element's pins. Typically, when a clock signal is received at a storage element (e.g., a CLK input of a flip-flop), the element stores the input signal value (e.g., the value at the D input of a flip-flop) and makes the stored value available through its outputs (e.g., the Q and Q' outputs of a flip-flop). The storage element is able to store the signal value as long as no new clock signal is received.

For example, a circuit designer can use the verification tool to simulate the performance of a circuit design over a period of time (i.e., t time-frames). After simulation, the designer can use the verification tool to specify a storage element and request the tool to display the signal value on an output line coupled to the specified storage element at a time-frame t. The verification tool can then display the signal value carried on the line coupled to the output of the specified storage element at the requested time-frame t. The verification tool displays the signal values carried on the input lines coupled to the input of the specified storage element at time-frame t−1. The input lines coupled to the input of the specified storage device are the outputs (i.e., the lines coupled to the outputs) of circuit components, including other storage elements, in the specified storage element's input cone. For the signal values carried on the lines coupled to the inputs of the storage elements at time-frame t−1, the verification tool displays the signal values carried on these lines at time-frame t−2, and so on.

Each of the signal values at a particular time-frame t are defined to be in the same frame. Therefore, a circuit with n number of consecutive storage elements in a signal path is associated with n+1 time-frames. Depending on the size of the circuit design (e.g., the number of consecutive storage elements or time-frames), the verification tool can display all or a portion of the n+1 time-frames. In other embodiments, the verification tool does not perform the simulation, but, can receive as input a circuit schematic diagram representation of a circuit design and the simulation results. The verification tool can then use the input data to determine the appropriate time-frames for the storage elements and display the signal values carried on the lines coupled to the inputs and outputs of the storage elements at the appropriate time-frames.

In another embodiment, the verification tool identifies and unfolds loops that may be present in the circuit design. For example, when a circuit has a loop, the signal value comes from a loop-back gate at an earlier time-frame. For each loop in the circuit, the verification tool identifies the circuit components that are involved in the loop, replicates the circuit components in the schematic diagram, identifies and determines the appropriate time-frames for the storage elements in the loop, and displays the signal values at the appropriate time-frames.

The verification tool preferably executes on one or more computers and may be locally or remotely accessible. The computers may be uniprocessor or multiprocessor machines. Additionally, these computers include an addressable storage medium or computer accessible medium, such as random access memory (RAM), erasable programmable read-only memory (EPROM), read-only memory (ROM), hard disks, floppy disks, laser disk players, optical disk players, digital video devices, and other components operable to transmit and/or store data. The verification tool is advantageously configured reside on the addressable storage medium and configured to execute on one or more processors.

It should also be understood that the verification tool, including any programs, modules, processes, methods, and the like, described herein are but an exemplary implementation and are not related, or limited, to any particular computer, apparatus, or computer language. Rather, various types of general purpose computing machines or devices may be used with programs constructed in accordance with the teachings described herein. Similarly, it may prove advantageous to construct a specialized apparatus to perform the method steps described herein by way of dedicated computer systems with hard-wired logic or programs stored in non-volatile memory, such as, by way of example, read-only memory (ROM).

Figure 3:
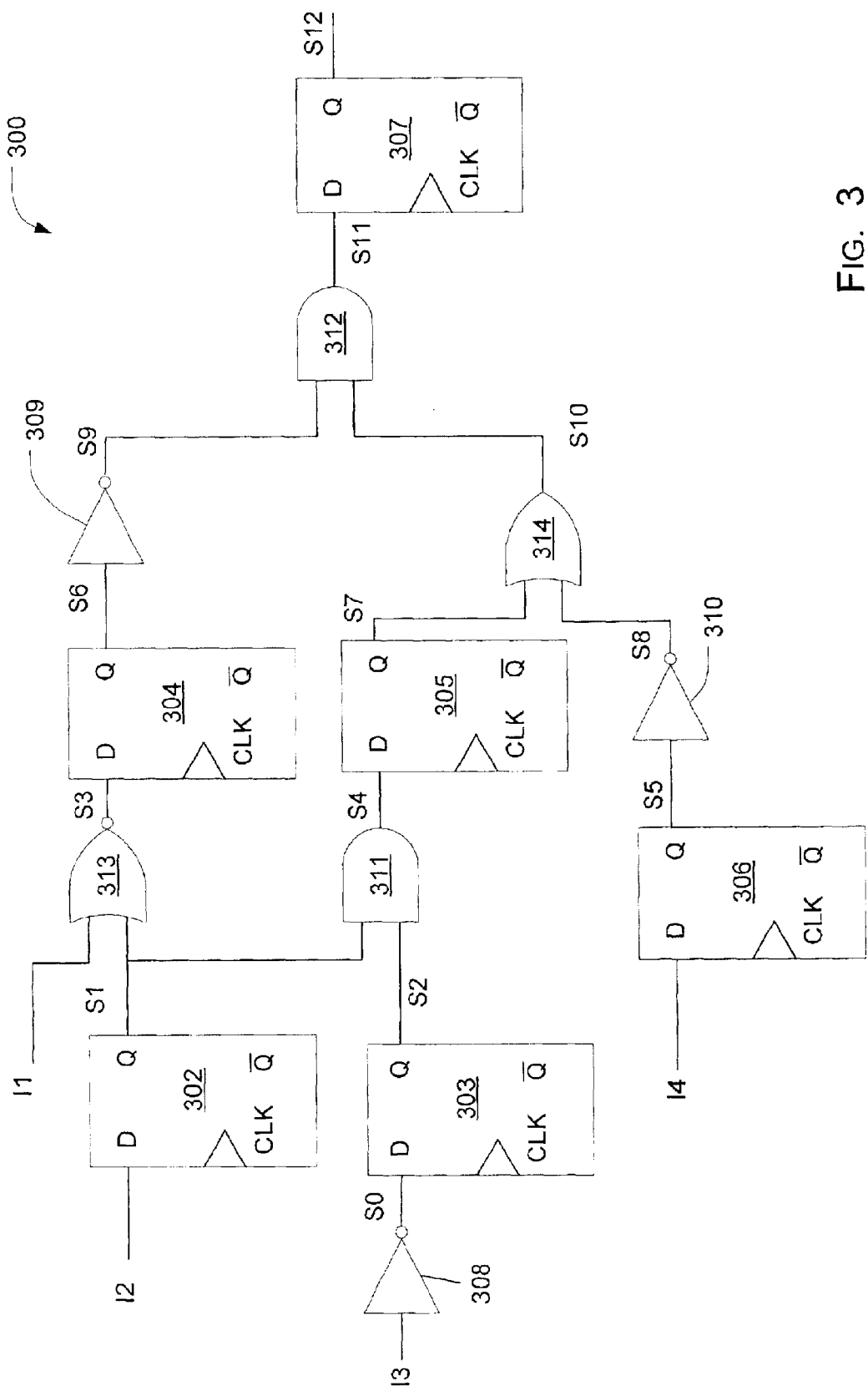
FIG. 3 illustrates a schematic diagram of an exemplary sequential circuit.

Referring now to the drawings, FIG. 3 illustrates a schematic diagram 300 of an exemplary sequential circuit. Schematic diagram 300 depicts a circuit that includes storage elements, combinatorial elements, and signal lines coupled to inputs and outputs of the elements in the circuit. In particular, the storage elements include six flip-flops 302–307, and the combinatorial elements include seven logic gates. The logic gates depicted include inverters 308–310, AND gates 311 and 312, NOR gate 313, and OR gate 314. The logic gates shown are sometimes referred to as primitive because they are at a very low level of granularity in Boolean logic.

The storage elements are also at a fine level of granularity, because each stores one bit and transfers the signal carried on its input line to its output pin (or signal line coupled to its output pin) each time the appropriate signal is applied to its clock (CLK) input. Examples of storage elements include, without limitation, flip-flops and latches. In other embodiments, the combinatorial elements and the storage elements can each be more complex. For example, a combinatorial element could consist of multiple primitive elements and perform a function like addition or multiplication. In this case, the adder element or multiplier element can be shown as a single symbol with the appropriate inputs and outputs. In short, circuit designs are usually hierarchical and can be represented at any level of the hierarchy. Embodiments as described herein are applicable to circuits represented at any level of hierarchy.

The circuit depicted by schematic diagram 300 also includes signal lines I1–I4 and S0–S12. Signal lines I1–I4 are each coupled to an input of an element in the circuit. As depicted, signal line I1 is coupled to an input of NOR gate 313, signal line I2 is coupled to the D input of flip-flop 302, signal line I3 is coupled to an input of inverter 308, and signal line I4 is coupled to the D input of flip-flop 306. Signal lines S0–S11 are each coupled to an output of one element and an input of another element in the circuit. For example, signal line S1 is coupled to an output of flip-flop 302 and an input of NOR gate 313 and, thus, signal line S1 couples the output of flip-flop 302 to the input of NOR gate 313. As depicted, the other signal lines S0 and S2–S11 couple one element to another element in the circuit as depicted. Signal line S12 is coupled to an output of flip-flop 307.

When stimulus is applied to the circuit elements in the form of signal value or level changes on the signal lines coupled to the inputs of the circuit elements, the signal values carried on the signal lines coupled to the outputs of the elements in the circuit have expected values or levels for certain time-frames. Typically, a clock with some regular cycle of low signal value and high signal value is applied to the clock inputs of the storage elements and the duration of the simulation is divided into time-frames related to the clock cycle. The verification tool monitors the signal lines and, in particular, the signal lines that couple the circuit elements during the simulation, and records the signal value carried on the signal lines at each time-frame during the duration of the simulation. The verification tool can then display the signal values carried on each signal line at the appropriate time-frame and this information can be used to diagnose the circuit's behavior when, for example, the signal value carried on signal line S12 is not as expected.

Figure 4:
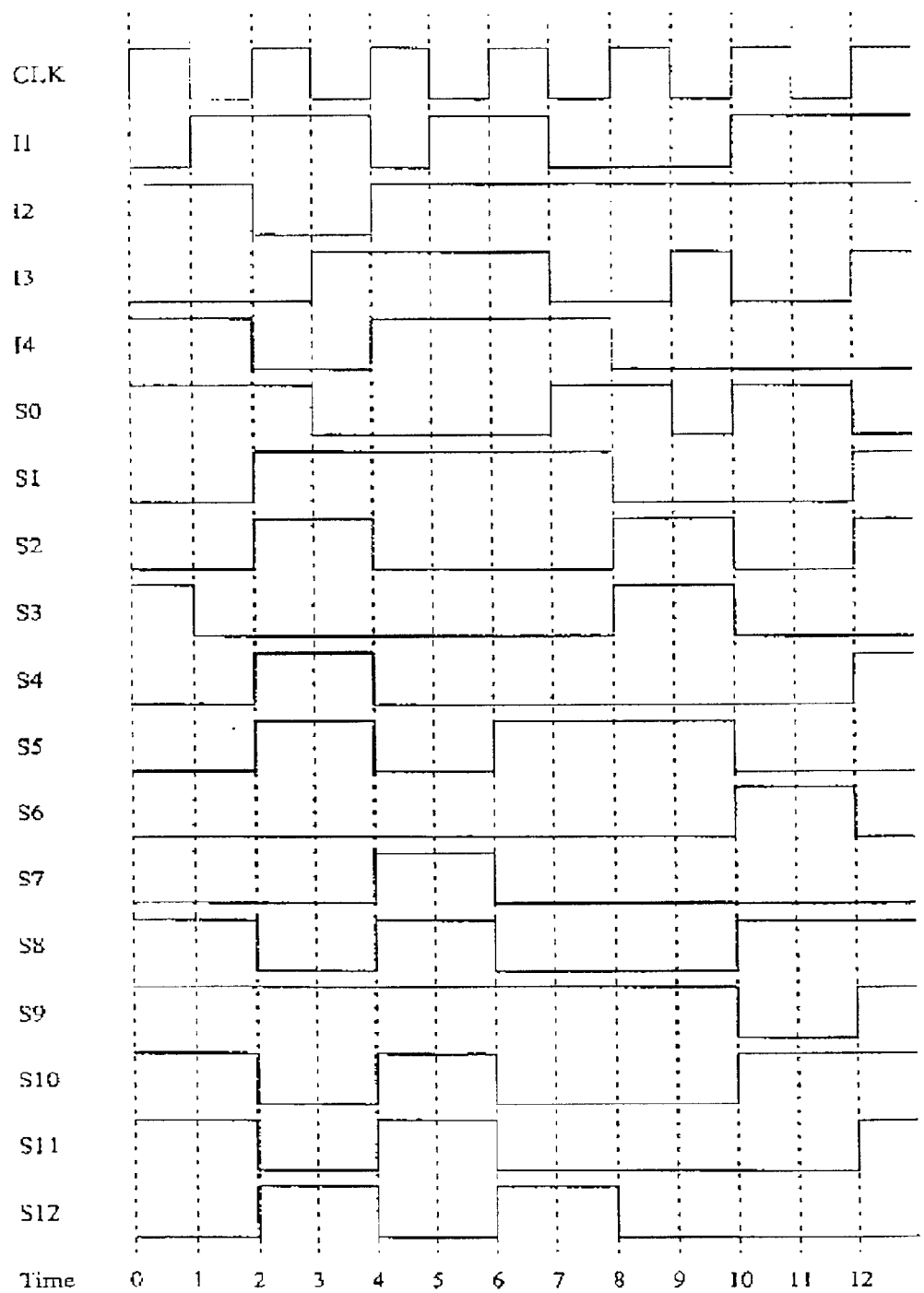
FIG. 4 illustrates an exemplary a timing diagram showing waveform data for the exemplary sequential circuit of FIG. 3.

FIG. 4 illustrates an exemplary a timing diagram showing waveform data for the exemplary sequential circuit of FIG. 3. The clock signal CLK, is shown at the top of the diagram and depicts the clock signal over twelve time-frames during the duration of the simulation. In this example, CLK cycles between a hi ("1") value and a lo ("0") value at or substantially at the beginning of each successive time-frame. The twelve time-frames in the simulation are labeled at the bottom of the diagram. The waveform data depicts the signal values ("0" or "1") carried on the signal lines I1–I14 and S0–S12 during the twelve time-frames in the simulation period. However, the information and data displayed in a waveform diagram such as FIG. 4, can be difficult to read and not useful when attempting to diagnose misbehavior of the circuit.

Figure 5:
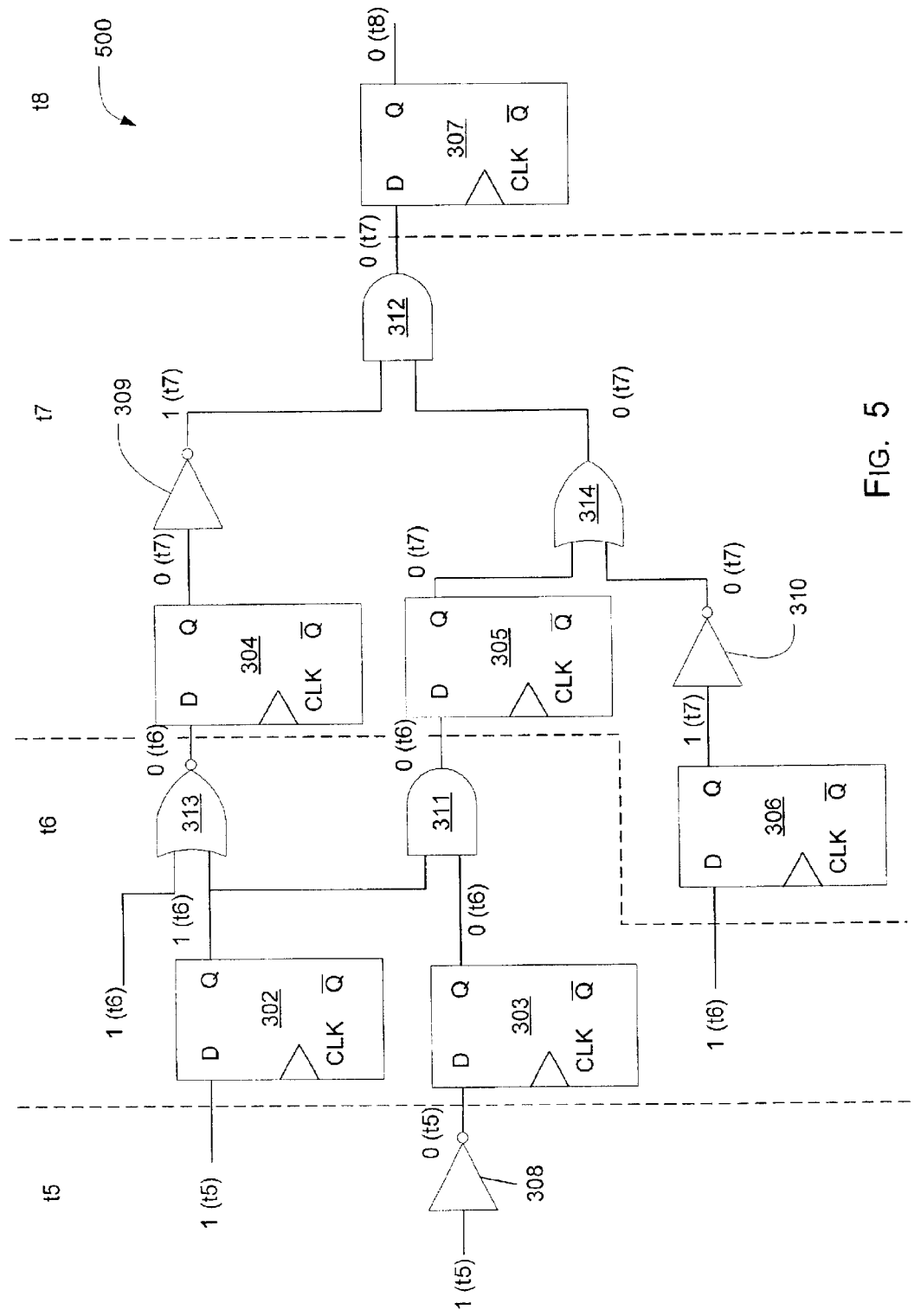
FIG. 5 illustrates a schematic diagram for the exemplary circuit of FIG. 3 depicting signal values during multiple time-frames, according to one embodiment.

FIG. 5 illustrates a schematic diagram 500 for the exemplary circuit of FIG. 3 depicting signal values during multiple time-frames, according to one embodiment. Schematic diagram 500 displays the signal values carried on signal lines I1–I4 and S0–S12 at different time-frames during the simulation. As shown, the signal line designations I1–I4 and S0–S12 are not shown in schematic diagram 500. In particular, schematic diagram 500 shows the signal value carried on signal line S12 (i.e., the signal line coupled to the output of flip-flop 307) at time-frame 8 and the signal values carried on the other signal lines I1–I4 and S0–S11 (not labeled in FIG. 5) at each line's respective time-frame. Thus, using the signal value information displayed over multiple and varying time-frames during a simulation period, a circuit designer can easily diagnose the circuit.

For example, the circuit designer may have requested that the verification tool display the output of the circuit of FIG. 3 at a time-frame 8 of a circuit simulation. The simulation tool can then generate and display schematic diagram 500. The verification tool uses the storage elements in the circuit to determine and identify the time-frame boundaries and, for each time-frame, determines the signal lines in the time-frame and their respective signal value from, for example, waveform data such as that illustrated in FIG. 4. The simulation tool can monitor the signal values during the simulation and store the signal values, along with each signal value's associated time-frame information, for subsequent use in generating and displaying schematic diagram 500.

Continuing the example, the output of the circuit, which is the signal value carried on the signal line coupled to the output of flip-flop 307, is shown to be 0 at t8, or time-frame 8. The display notation shows the signal value and the associated time-frame identification in parenthesis. For example, "0(t8)" means the associated signal line carries or has a signal value of 0 at time-frame 8. The signal value carried on the signal line coupled to the D input of flip-flop 307 is shown to be 0 at t7. All of the signal values carried on the signal lines down to the preceding downstream storage elements (i.e., flip-flops 304–306), including signal lines coupled to one or more logic gates as illustrated, are also shown at t7. These signal values are denoted by a postfix of t(7).

Likewise, flip-flops 304, 305, and 306 show signal values carried on signal lines coupled to their outputs at t7 and signal values carried on signal lines coupled to their D inputs at t6. These are respectively denoted by the postfixes (t7) and (t6). Furthermore, the signal values carried on the respective signal lines down to the preceding downstream storage elements (i.e., flip-flop 302 and 303) are also shown at t6. Further downstream, the signal values carried on signal lines coupled to flip-flops 302 and 303 are shown at t5 and is denoted by a postfix of (t5).

The circuit has three consecutive levels of storage elements. The verification tool shows four signal time-frames, from time-frame 8 backwards to time-frame 5. These time-frames are further illustrated in FIG. 5 by the designations t5 to t8 and the dotted-lines that distinguish the illustrated time-frames. For example, the circuit elements to the right of the dotted-line between t7 and t8 can be thought of as being in t8. Thus, flip-flop 307 can be thought of as being at t8. Likewise, inverter 309, OR gate 314, and AND gate 312 can each be thought of as being at t7. In general, the circuit elements (e.g., gates, signal lines, etc.) that appear within a time-frame can be thought of as being at that particular time-frame. In another embodiment, the dotted-lines that designate two adjacent time-frames may not be shown.

In one embodiment, for a circuit with n consecutive levels of storage elements, the verification tool displays the signal values at n+1 time-frames (e.g., time-frame t, time-frame t−1, time-frame t−2, . . . , to time-frame t−n), where t is the time-frame requested by the designer. In another embodiment, the verification tool displays signal values from more than one time-frame for one or more signal lines. In still another embodiment, depending on the signal line and time-frame requested by the designer, the verification tool can display signal values at both preceding and succeeding time-frames.

In other embodiments, the circuit elements can be complex elements that are made up of multiple primitive elements. In these embodiments, the verification tool can determine the elements and signal lines coupling the elements in a complex element and monitor the signal values over the time-frames comprising a simulation period. The verification tool can then display the complex elements, for example, in their primitive element form, and display the associated signal values at the appropriate time-frames.

A circuit may contain one or more loops. In a loop, a signal value loops from a gate at one time-frame back to a loop-back gate at an earlier time-frame. A loop-back gate is an element that receives as input the signal value from the gate at a succeeding time-frame. For example, a signal line coupled to an output of one circuit element loops back and is coupled to an input of another circuit element. One embodiment of the verification tool can identify the loops in a circuit design and unfold the each loop before displaying the signal values at multiple time-frames. Thus, the verification tool does not display the loop in the schematic diagram representation of the circuit design. FIGS. 6A–E illustrate a exemplary process for unfolding loops in a circuit design, according to one embodiment.

Figure 6A:
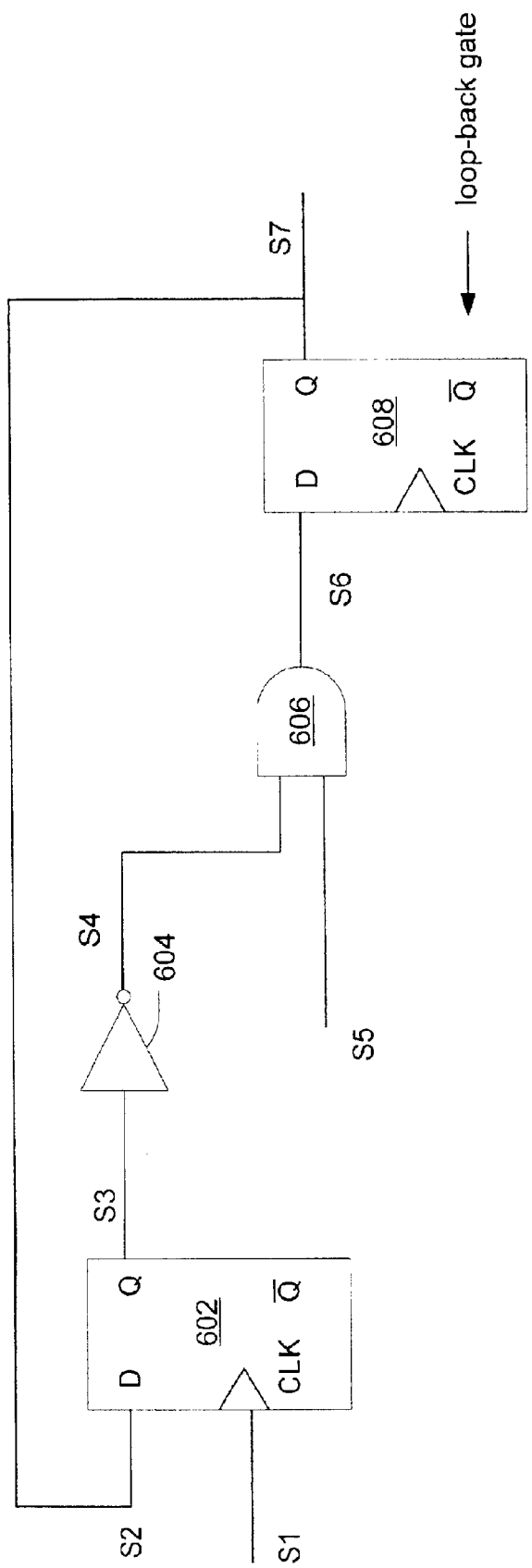
FIGS. 6A–E illustrate a exemplary process for unfolding loops in a circuit design, according to one embodiment.

FIG. 6A illustrates an exemplary schematic diagram of a circuit that contains a loop. The loop involves signal lines S2, S3, S4, S6, and S7 and the circuit elements coupled to the aforementioned signal lines. In particular, signal line S2 is coupled to signal line S7 and the D input of flip-flop 602, signal line S3 is coupled to an output of flip-flop 602 and an input of inverter 604, signal line S4 is coupled to the output of inverter 604 and an input of AND gate 606, signal line S6 is coupled to the output of AND gate 606 and the D input of flip-flop 608, and signal line S7 is coupled to an output of flip-flop 608. The verification tool can identify and unfold the loop, or portions of the loop as necessary to display the signal values at the appropriate time-frames.

For example, the verification tool may have previously performed a simulation on the circuit and received a request to display the signal value carried on signal line S7 at tine-frame 8 (t8). The verification tool can then create the schematic diagram representation of the circuit one time-frame at a time, unfolding any loops identified in the circuit as necessary as illustrated in FIGS. 6B–E.

Figure 6B:
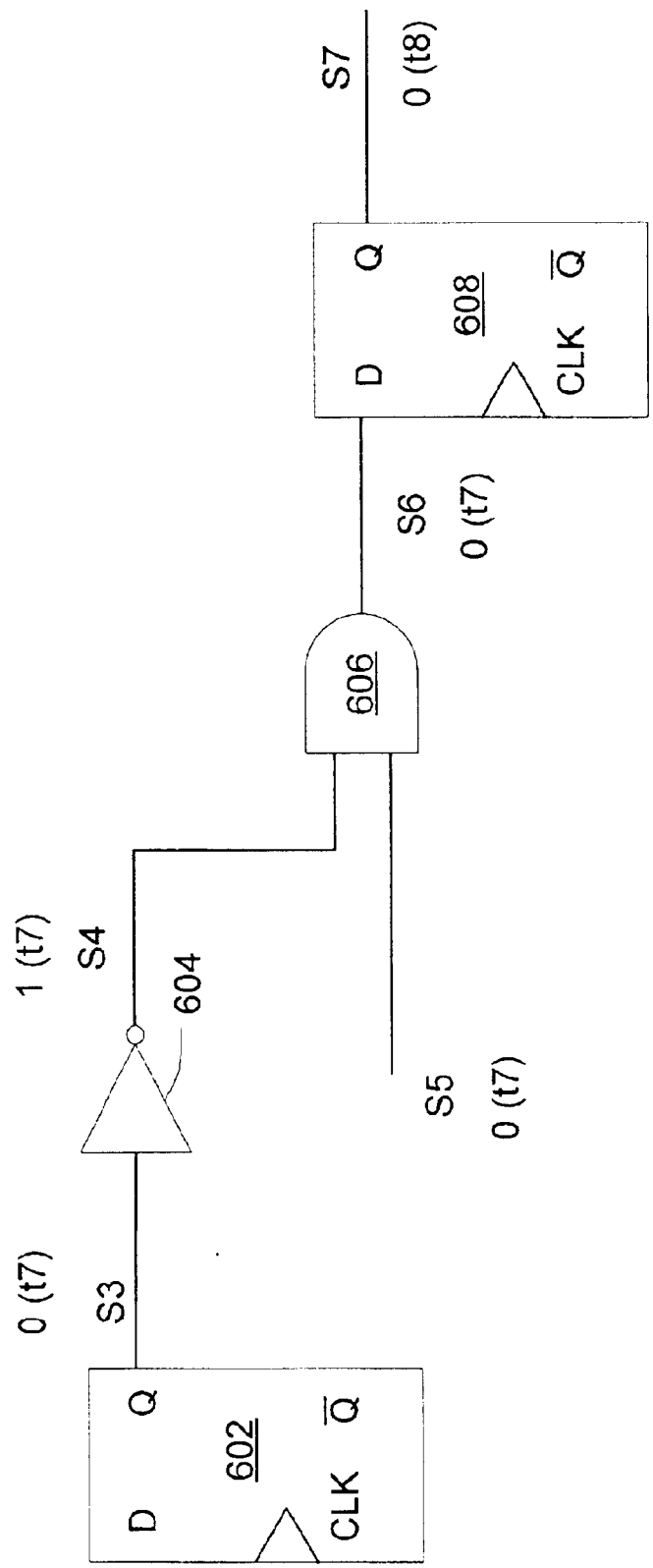

FIG. 6B illustrates a schematic diagram of the circuit in FIG. 6A at t8 to preceding t7. The schematic diagram includes flip-flops 602 and 608, inverter 604, AND gate 606, and the signal lines coupled to these elements. In particular, signal line S7 is shown to carry signal value 0 at t8, signal lines S3, S4, and S6 are shown to carry signal values 0, 1, and 0, respectively, at t7. The verification tool does not replicate the elements in the loop at t8 and t7.

Figure 6C:
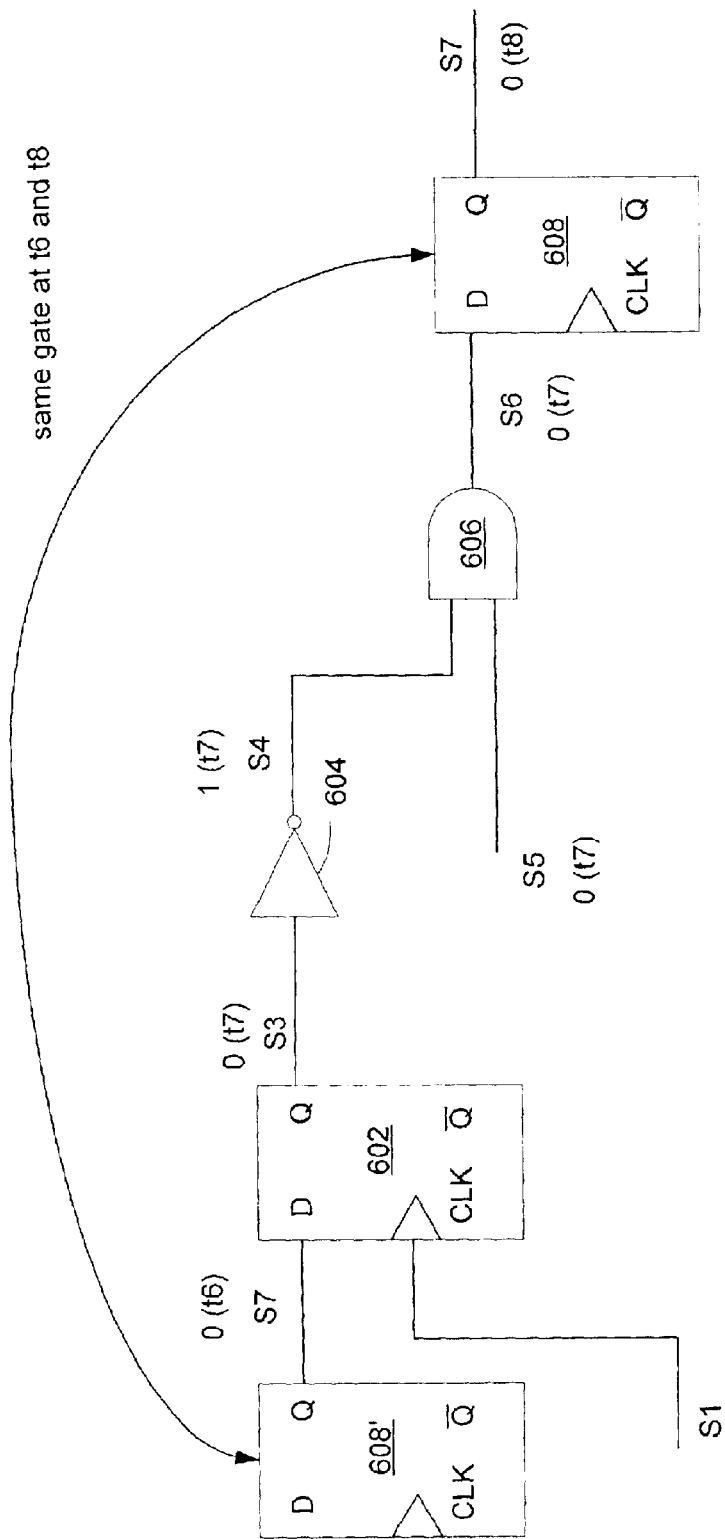

FIG. 6C illustrates a schematic diagram of the circuit in FIG. 6A at t8 to preceding t7 and t6. The verification tool starts to replicate elements in the loop at t6. As illustrated in FIG. 6C, in addition to the circuit elements illustrated in FIG. 6B, flip-flop 608 is replicated at t6 (depicted as flip-flop 608') and signal line S7 is replicated and shown to couple one output of flip-flop 608' to the D input of flip-flop 602. This signal line S7 is shown to carry signal value 0 at t6 and replaces (or was previously represented as) signal line S2 in FIG. 6A.

Figure 6D:
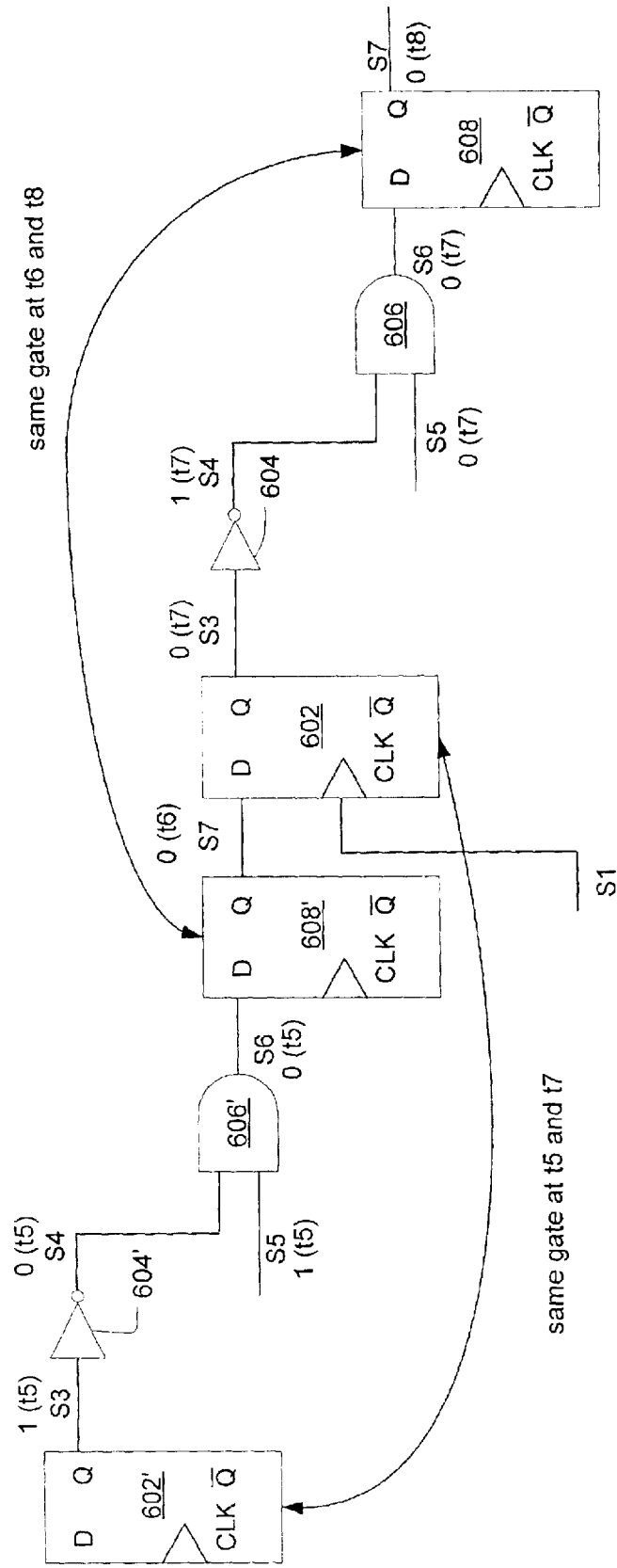

FIG. 6D illustrates a schematic diagram of the circuit in FIG. 6A at t8 to preceding t7, t6, and t5. The verification tool continues to replicate more of the circuit elements in the loop as it works further backwards in time. As illustrated in FIG. 6D, from t8 to preceding t5, the loop is replicated one time. For example, AND gate 606, inverter 604, flip-flop 602 (depicted as, AND gate 606', inverter 604', and flip-flop 602') and the signal lines coupled these elements are replicated at t5. In particular, flip-flop 602 is replicated at t5 as flip-flop 602'.

Figure 6E:
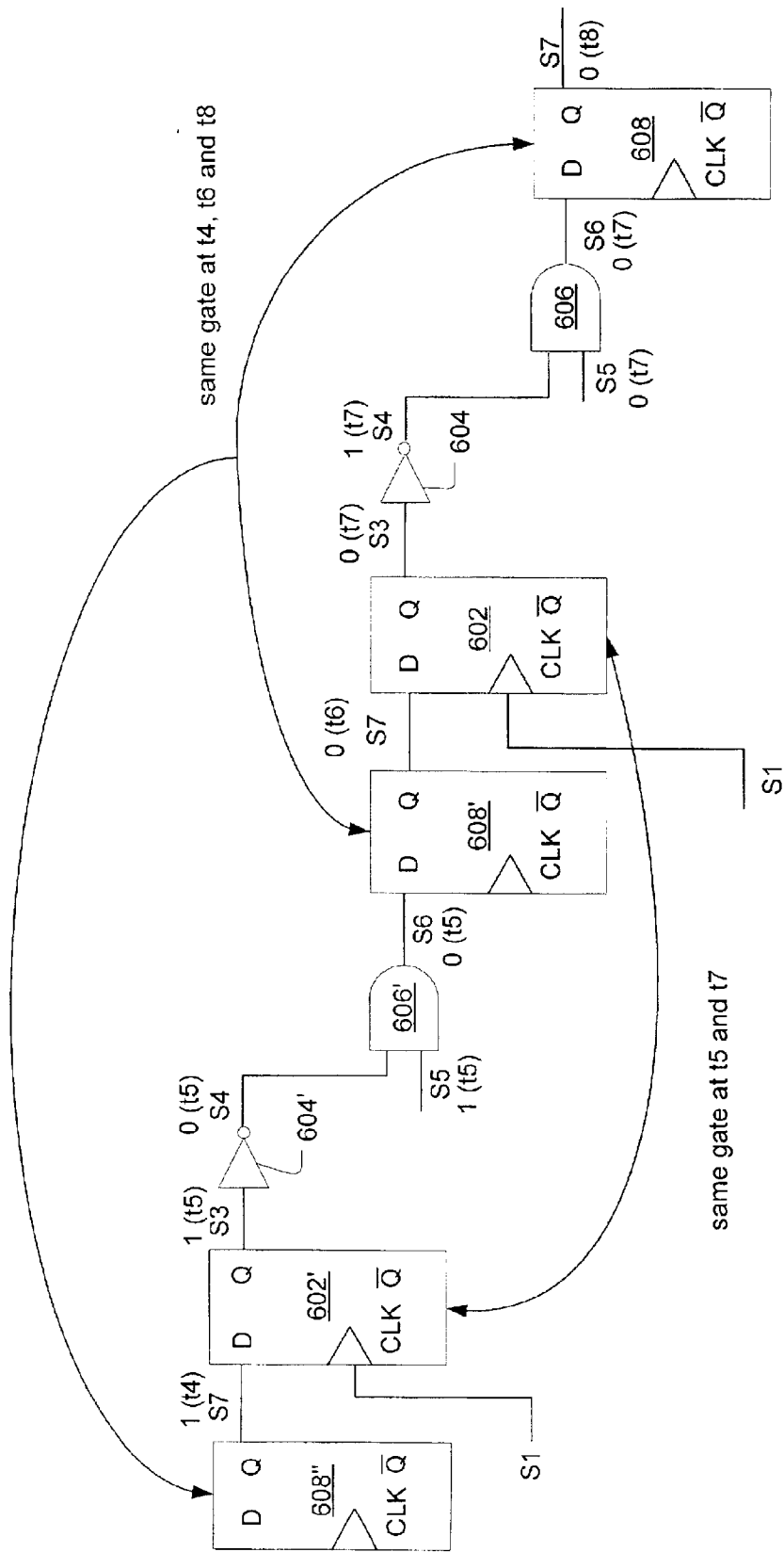

FIG. 6E illustrates a schematic diagram of the circuit in FIG. 6A at t8 to preceding t4. The verification tool starts to replicate the circuit elements in the loop for a second time at t5. As illustrated in FIG. 6E, in addition to the circuit elements illustrated in FIG. 6D, flip-flop 608 is replicated at t4 (depicted as flip-flop 608") for a second time and signal line S7 is also replicated for a second time and shown to couple couples one output of flip-flop 608" to the D input of flip-flop 602'. This signal line S7 is further shown to carry signal value 1 at t4. The verification tool can continue unfolding the loop in this manner as it continues to work backwards in time from t8 to t0.

This invention may be provided in other specific forms and embodiments without departing from the essential characteristics as described herein. The embodiments described above are to be considered in all aspects as illustrative only and not restrictive in any manner. The following claims rather than the foregoing description indicate the scope of the invention.

What is claimed is:

1. A method for displaying a schematic diagram of a circuit showing multiple time-frame signal values across storage elements, the method comprising:
   identifying a plurality of time-frames in a circuit, the plurality of time-frames being determined by a number of consecutive storage elements in a signal path in the circuit;
   receiving a request to display signal values associated with a first storage element at a time-frame t;
   displaying the first storage element:
   displaying a first signal value carried on a first signal line coupled to an output of the first storage element, the first signal value being at time-frame t;
   displaying the first signal line;
   displaying a second signal value carried on a second signal line coupled to an input of the first storage element, the second signal value being at time-frame t−1; and
   displaying the second signal line.

2. The method of claim 1 further comprising:
   identifying a second storage element in the circuit, the second storage element preceding the first storage element, the second storage element being coupled to the first storage element via one or more signal lines; and
   displaying a third signal value carried on a third signal line coupled to an output of the second storage element, the third signal value being at time-frame t−1.

3. The method of claim 2 further comprising displaying a fourth signal value carried on a fourth signal line coupled to an input of the second storage element, the fourth signal value being at time-frame t−2.

4. The method of claim 1 further comprising:
   identifying a third signal line in the circuit, the third signal line being coupled to one input of the first storage element; and
   displaying a third signal value carried on the third signal line, the third signal value being at time-frame t−1.

5. The method of claim 1 further comprising:
   identifying a third signal line in the circuit, the third signal line being in time-frame t−1; and
   displaying a third signal value carried on the third signal line, the third signal value being at time-frame t−1.

6. The method of claim 1 further comprising:
   identifying a third signal line in the circuit, the third signal line being in time-frame t−2; and
   displaying a third signal value carried on the third signal line, the third signal value being at time-frame t−2.

7. The method of claim 1, wherein the second signal line is coupled to an output of a circuit element, the circuit element being at time-frame t−1.

8. The method of claim 1 further comprising monitoring a simulation of the circuit, the simulation being over a duration of a number of time-frames.

9. A method for displaying signal values at multiple time-frames comprising:
   identifying a plurality of storage elements in a signal path in a circuit;
   displaying a first storage element of the plurality of storage elements;
   displaying a first signal value carried on a first signal line coupled to at least one output of the first storage element at a first time-frame;
   displaying the first signal line;
   displaying a second signal value carried on a second signal line coupled to at least one input of the first storage element at a second time-frame; and
   displaying the second signal line.

10. The method of claim 9, wherein the first time-frame is requested by a user.

11. The method of claim 9, wherein the first storage element is requested by a user.

12. The method of claim 9, wherein the second time-frame immediately precedes the first time-frame.

13. The method of claim 9, wherein the first time-frame immediately precedes the second time-frame.

14. The method of claim 9 further comprising displaying a third signal value carried on a third signal line coupled to one output of a second storage element at a third time-frame.

15. The method of claim 14, wherein the third time-frame immediately precedes the second time-frame.

16. The method of claim 9 further comprising:
   identifying a third signal line in the circuit, the third signal line being coupled to the input of the first storage element via a second storage element, wherein a signal line couples an output of the second storage element to one input of the first storage element; and
   displaying a third signal value carried on the third signal line at a third time-frame.

17. A computer-readable storage medium having stored thereon computer instructions that, when executed by a computer, cause the computer to:
   identify a plurality of time-frames in a circuit, the plurality of time-frames being determined by a number of consecutive storage elements in a signal path in the circuit;
   receive a request to display signal values associated with a first storage element at a time-frame t;
   display the first storage element;
   display a first signal value carried on a first signal line coupled to an output of the first storage element, the first signal value being at time-frame t;
   display the first signal line;
   display a second signal value carried on a second signal line coupled to an input of the first storage element, the second signal value being at time-frame t−1; and
   display the second signal line.

18. The computer-readable storage medium of claim 17, wherein the computer instructions that identify the plurality of time-frames in the circuit further comprise computer instructions that, when executed by a computer, cause the computer to:

identify a second storage element in the circuit, the second storage element preceding the first storage element, the second storage element being coupled to the first storage element via one or more signal lines; and display a third signal value carried on a third signal line coupled to an output of the second storage element, the third signal value being at time-frame t−1.

19. The computer-readable storage medium of claim 18, wherein the computer instructions that identify the plurality of time-frames in the circuit further comprise computer instructions that, when executed by a computer, cause the computer to display a fourth signal value carried on a fourth signal line coupled to an input of the second storage element, the fourth signal value being at time-frame t−2.

20. The computer-readable storage medium of claim 17, wherein the computer instructions that identify the plurality of time-frames in the circuit further comprise computer instructions that, when executed by a computer, cause the computer to:

identify a third signal line in the circuit, the third signal line being coupled to one input of the first storage element; and display a third signal value carried on the third signal line, the third signal value being at time-frame t−1.

21. The computer-readable storage medium of claim 17, wherein the computer instructions that identify the plurality of time-frames in the circuit further comprise computer instructions that, when executed by a computer, cause the computer to:

identify a third signal line in the circuit, the third signal line being in time frame t−1; and display a third signal value carried on the third signal line, the third signal value being at time-frame t−1.

22. The computer-readable storage medium of claim 17, wherein the computer instructions that identify the plurality of time-frames in the circuit further comprise computer instructions that, when executed by a computer, cause the computer to:

identify a third signal line in the circuit, the third signal line being in time-frame t−2; and display a third signal value carried on the third signal line, the third signal value being at time-frame t−2.

23. The computer-readable storage medium of claim 17, wherein the computer instructions that identify the plurality of time-frames in the circuit further comprise computer instructions that, when executed by a computer, cause the computer to monitor a simulation of the circuit, the simulation being over a duration of a number of time-frames.

24. A computer-readable storage medium having stored thereon computer instructions that, when executed by a computer, cause the computer to:

identify a plurality of storage elements in a signal path in a circuit;

display a first storage element of the plurality of storage elements;

display a first signal value carried on a first signal line coupled to at least one output of the first storage element at a first time-frame;

display the first signal line;

display a second signal value carried on a second signal line coupled to at least one input of the first storage element at a second time-frame; and display the second signal line.

25. The computer-readable storage medium of claim 24, wherein the first time-frame is requested by a user.

26. The computer-readable storage medium of claim 24, wherein the first storage element is requested by a user.

27. The computer-readable storage medium of claim 24, wherein the second time-frame immediately precedes the first time-frame.

28. The computer-readable storage medium of claim 24, wherein the first time-frame immediately precedes the second time-frame.

29. The computer-readable storage medium of claim 24, wherein the computer instructions that identify the plurality of storage elements in the signal path in the circuit further comprise computer instructions that, when executed by a computer, cause the computer to display a third signal value carried on a third signal line coupled to one output of a second storage element at a third time-frame.

30. The computer-readable storage medium of claim 29, wherein the third time-frame immediately precedes the second time-frame.

31. The computer-readable storage medium of claim 24, wherein the computer instructions that identify the plurality of storage elements in the signal path in the circuit further comprise computer instructions that, when executed by a computer, cause the computer to:

identify a third signal line in the circuit, the third signal line being coupled to the input of the first storage element via a second storage element, wherein a signal line couples an output of the second storage element to one input of the first storage element; and display a third signal value carried on the third signal line at a third time-frame.

32. A method for displaying a schematic diagram of a circuit showing multiple time-fine signal values across storage elements, the circuit having one or more loops, the method comprising:

identifying a loop in a signal path, the loop comprising:
a first element at a first time-frame;
a second element at a second time-frame;
a first signal line coupled to an output of the first element and an input of the second element; and
a second signal line coupled to an output of the second element and an input of the first element;

displaying the first element;

displaying the second element;

replicating the first element at a third time-frame;

displaying the replicated first element;

displaying a third signal line coupling an output of the replicated first element to the input of the second element;

displaying a first signal value carried on the output of the first element at the first time-frame;

displaying a second signal value carried on the second signal line at the second time-frame;

displaying the second signal line;

displaying a third signal value carried on the third signal line at the third time-frame; and displaying the third signal line.

33. The method of claim 32, wherein the first element is a storage element.

34. The method of claim 32, wherein the second element is a storage element.

35. The method of claim 32, wherein the first time-frame immediately succeeds the second time-frame and the second time-frame immediately succeeds the third time-frame.

36. The method of claim 32 further comprising:
replicating the second element at a fourth time-frame;

coupling an output of the replicated second element to the input of the replicated first element via a fourth signal line; and displaying a fourth signal value carried on the fourth signal line at the fourth time-frame.

37. A computer-readable storage medium having stored thereon computer instructions that, when executed by a computer, cause the computer to:

identify a loop in a signal path, the loop comprising:
a first element at a first time-frame;
a second element at a second time-frame;
a first signal line coupled to an output of the first element and an input of the second element; and
a second signal line coupled to an output of the second element and an input of the first element;

display the first element;

display the second element;

replicate the first element at a third time-frame;

display the replicated first element;

display a third signal line coupling an output of the replicated first element to the input of the second element;

display a first signal value carried on the output of the first element at the first time frame;

display a second signal value carried on the second signal line at the second time-frame;

display the second signal line;

display a third signal value carried on the third signal line at the third time frame; and display the third signal line.

38. The computer-readable storage medium of claim 37, wherein the first element is a storage element.

39. The computer-readable storage medium of claim 37, wherein the second element is a storage element.

40. The computer-readable storage medium of claim 37, wherein the first time-frame immediately succeeds the second time-frame and the second time-frame immediately succeeds the third time-frame.

41. The computer-readable storage medium of claim 37, wherein the computer instructions that identify the loop further comprise computer instructions that, when executed by a computer, cause the computer to:

replicate the second element at a fourth time-frame;

couple an output of the replicated second element to the input of the replicated first element via a fourth signal line; and display a fourth signal value carried on the fourth signal line at the fourth time-frame.

* * * * *